(12) United States Patent
Tanaka et al.

(10) Patent No.: US 6,700,402 B2
(45) Date of Patent: Mar. 2, 2004

(54) OUTPUT CONTROL CIRCUIT AND OUTPUT CONTROL METHOD

(75) Inventors: Souhei Tanaka, Kanagawa (JP); Masafumi Wataya, Kanagawa (JP); Noriyuki Suzuki, Tokyo (JP); Akira Kuronuma, Tokyo (JP); Toru Nakayama, Kanagawa (JP); Takuji Katsu, Kanagawa (JP)

(73) Assignee: Canon Kabushiki Kaisha (JP)

(*) Notice: Subject to any disclaimer, the term of this patent is extended or adjusted under 35 U.S.C. 154(b) by 0 days.

(21) Appl. No.: 10/139,818

(22) Filed: May 6, 2002

(65) Prior Publication Data

US 2002/0190757 A1 Dec. 19, 2002

(30) Foreign Application Priority Data

May 10, 2001 (JP) .................................. 2001-140478

(51) Int. Cl.$^7$ ...................... H03K 19/173; H03K 19/00
(52) U.S. Cl. .................... 326/37; 326/101; 326/105
(58) Field of Search ............... 326/37–39, 41, 326/47, 101, 104, 105

(56) References Cited

U.S. PATENT DOCUMENTS

| 4,758,746 A | * | 7/1988 | Birkner et al. | ............... 326/40 |
| 5,471,155 A | * | 11/1995 | Steele | ........................... 326/39 |
| 5,684,413 A | * | 11/1997 | Shimanek et al. | ............ 326/41 |
| 6,297,684 B1 | * | 10/2001 | Uyehara et al. | ............. 327/408 |

FOREIGN PATENT DOCUMENTS

| JP | 01-41257 A | 2/1989 |
| JP | 5-302961 A | 11/1993 |

* cited by examiner

*Primary Examiner*—James H Cho
(74) *Attorney, Agent, or Firm*—Rossi & Associates

(57) ABSTRACT

There is provided an output control circuit provided in an integrated circuit that enables any arbitrary internal signal to be specified and output from any output terminal, and hence enable the monitoring of a large number of internal signals even if only a small number of output terminals are provided. A plurality of external output terminals output a plurality of signals existing in the integrated circuit. A plurality of signal output circuits are provided, to which the plurality of internal signals are mutually input. Each of the signal output circuits comprises a signal group select circuit that selects a predetermined signal group from the plurality of internal signals, a logic circuit that carries out logical operations on the selected signal group, and an external output circuit that outputs signals resulting from the logical operations via one of the external output terminals.

5 Claims, 8 Drawing Sheets

OUTPUT CONTROL CIRCUIT AND OUTPUT CONTROL METHOD

BACKGROUND OF THE INVENTION

1. Field of the Invention

This invention relates to an output control circuit and output control method for monitoring a plurality of internal signals existing in an integrated circuit such as a large-scale integrated (LSI) circuit.

2. Description of the Related Art

In recent years, LSI circuits having high levels of integration have been realized due to remarkable advances in semiconductor technology. A central processing unit (CPU), memory elements, several hundreds of thousands of logic circuits and the like, which previously had been configured as separate circuits, can now be integrated into a single chip.

However, this higher level of integration makes it extremely difficult to evaluate or test LSI circuits. Namely, if a system that incorporates large-scale integration does not operate properly, in contrast to the case where the CPU, memory elements, logic circuits and such are configured on separate chips, thereby enabling easy observation of the signal lines between individual semiconductor devices and relatively simple discovery of the location of a defect, in the case of single chip solutions, internal signal lines are not easily observable.

To address this issue, Japanese Laid-Open Patent Publication (Kokai) Nos. S64-41257 and H5-302961 proposed circuits for monitoring internal signals in which one signal selected from a plurality of internal signals is output from a designated output terminal.

However, in the circuits disclosed in the above publications, selected internal signals are fixed to respective designated output terminals in one-to-one correspondence. Thus, even if a plurality of output terminals are provided, the number of simultaneously observable internal signals is limited by the number of output terminals provided and the selection circuit that selects the internal signals. If a large number of internal signals are to be observed simultaneously, it is necessary to provide the same number of output terminals as the internal signals to be observed.

SUMMARY OF THE INVENTION

It is an object of the present invention to provide an output control circuit and output control method that enable any arbitrary internal signal to be specified and output from any output terminal, and hence enable the monitoring of a large number of internal signals even if only a small number of output terminals are provided.

To attain the above object, a first aspect of the present invention provides an output control circuit provided in an integrated circuit, comprising a plurality of external output terminals that output a plurality of signals existing in the integrated circuit, and a plurality of signal output circuits to which the plurality of internal signals are mutually input, wherein each of the signal output circuits comprises a signal group select circuit that selects a predetermined signal group from the plurality of internal signals, a logic circuit that carries out logical operations on the selected signal group, and an external output circuit that outputs signals resulting from the logical operations via one of the external output terminals.

In a preferred form of the first aspect, the logic circuit comprises a plurality of individual logic circuits that individually carries out logical operations on signals forming the selected signal group, and a logic select circuit that selects one individual logic circuit from the plurality of individual logic circuits, and the external output circuit outputs a signal resulting from a logical operation carried out by the selected individual logic circuit via one of the external output terminals.

The logic circuit may preferably a type that carries out a logical OR operation that causes a predetermined output to be output when at least one of signals forming the selected signal group is in an active state, or a type that carries out a logical AND operation that causes a predetermined output to be output when all signals forming the selected signal group are in active states.

In a preferred embodiment of the first aspect, the logic circuit comprises at least one logical OR circuit that carries out a logical OR operation that causes a predetermined output to be output when at least one of signals forming the selected signal group is in an active state, at least one logical AND circuit that causes a predetermined output to be output when all signals forming the selected signal group are in active states, and an operation select circuit that selects either the logical OR circuit or the logical AND circuit.

To attain the above object, a second aspect of the present invention provides an output control method of outputting a plurality of internal signals existing within an integrated circuit via external output terminals, comprising a selection step of selecting a predetermined signal group from the plurality of internal signals, using a plurality of signal output circuits to which the plurality of internal signals are mutually input, a logical operation step of carrying out logical operations on the selected signal group, and an output step of outputting signals resulting from logical operations via the external output terminals.

In a preferred form of the second aspect, in the logical operation step one logic circuit is selected from a plurality of individual logic circuits that carries out individual logical operations on signals forming the selected signal group, and in the output step a signal resulting from a logical operation carried out by the selected individual logic circuit is output via one of the external output terminals.

Preferably, in the logical operation step a logical OR operation is carried out to cause a predetermined output to be output when at least one of signals forming the selected signal group is in an active state. Alternatively, in the logical operation step a logical AND operation is carried out to cause a predetermined output to be output when all signals forming the selected signal group are in active states.

In a preferred embodiment of the second aspect, the logical operation step comprises a logical OR step of carrying out a logical OR operation that causes a predetermined output to be output when at least one signal forming the selected signal group is in an active state, a logical AND step of carrying out a logical AND operation that causes a predetermined output to be output when all signals forming the selected signal group are in active states, and an operation select step of selecting either the logical OR step or the logical AND step.

According to the present invention constructed as above, any arbitrary internal signal can be designated for outputting from any external output terminal. Therefore, by providing the same number of signal output circuits as the number of internal signals that need to be monitored simultaneously, a large number of internal signals can be monitored even if there are only a small number of external output terminals.

The above and other objects, features and advantages of the invention will become apparent from the following detailed description taken in conjunction with the accompanying drawings.

DESCRIPTION OF THE PREFERRED EMBODIMENTS

Embodiments of the present invention will now be described in detail with reference to the drawings.

Figure 1:
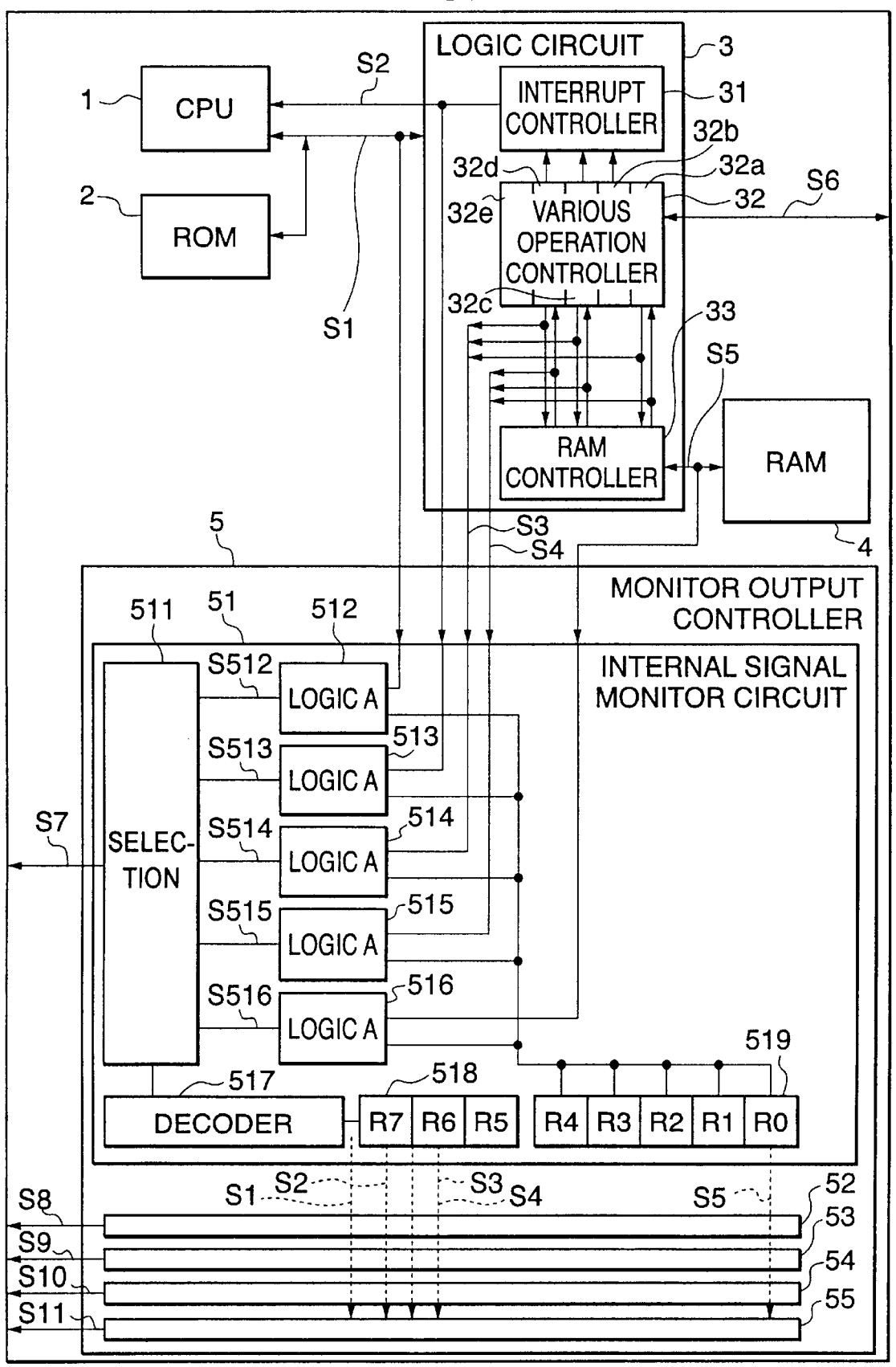
FIG. 1 is a block diagram illustrating the internal configuration of a large-scale integrated (LSI) circuit incorporating an output control circuit according to a first embodiment of the present invention.

FIG. 1 is a block diagram illustrating the internal configuration of a large-scale integrated (LSI) circuit incorporating an output control circuit according to a first embodiment of the present invention. In FIG. 1, a central processing unit (CPU) 1 controls operation of this LSI circuit. From a storage unit (ROM) 2 that stores various commands, data, tables and the like, commands, data and the like are sequentially read via a CPU control bus S1, for execution of the commands.

A logic circuit 3 is connected to the CPU control bus S1. The logic circuit 3 performs various processing of data input from an external device via an interface line S6. During the various processing, data is temporarily stored in a RAM 4 formed by a DRAM via a control bus S5, and data stored in the RAM 4 is read again, then used in the next processing and results of the processing are output to the external device via interface S6. Further, the CPU 1 assesses the operating status of the logic circuit 3 according to an interrupt signal output from an interrupt controller 31 via an interrupt signal bus S2. To perform these processing, the logic circuit 3 is comprised of the interrupt controller 31, a various operation controller 32 and a RAM controller 33.

The various operation controller 32 is comprised of five blocks 32a, 32b, 32c, 32d and 32e. The block 32a transfers data, which has been input via the interface line S6, to the RAM 4. The block 32b manages the quantity or number of data input via the interface line S6, and when either the first data has been received or a predetermined quantity of data has been received, the block 32b generates an interrupt signal to notify the CPU 1 of that fact.

The block 32c processes data that has been stored in the RAM 4 and then writes the processed data back again to the RAM 4, and when processing of a predetermined quantity of data is completed, the block 32c generates an interrupt signal to notify CPU 1 of that fact. The block 32d reads data stored in the RAM 4 while converting the data into a predetermined number of data strings, and outputs the read data via the interface line S6, and upon completion of the processing, the block 32d generates an interrupt signal to notify CPU 1 of that fact. The block 32e extracts a specific data string from data that has been read out by the block 32d and stores the extracted data string.

When the blocks 32a, 32c and 32d access the RAM 4, they output a REQ signal (REQa, REQc, REQd signals) to the RAM controller 33 to request data read or write. The RAM controller 33 prioritizes the requests from the blocks 32a, 32c and 32d, and in timing in which reading or writing is possible, controls the control bus S5 for the RAM 4 and returns an ACK signal (ACKa*, ACKc*, ACKd* signals) to the block that has completed processing.

Each of the blocks 32a, 32c and 32d judges the completion of read or write operations according to this ACK signal. Next, each of the blocks 32b, 32c and 32d outputs an interrupt signal (INTb, INTc, INTd signals), which notifies CPU 1 that a predetermined process has been completed, to the interrupt controller 31.

Therefore, in the case where the CPU 1, ROM 2, RAM 4 and the logic circuit 3 are integrated into a single LSI circuit, unless some means are implemented in advance to monitor the CPU control bus S1, interrupt signal bus S2, RAM control bus S5 and the like, it will be difficult to verify the operations of these elements. Additionally, in the case where a plurality of operation controllers simultaneously request access to the RAM 4, monitoring is necessary to check whether processing is being performed correctly. Therefore, in the present embodiment, a monitor output control unit 5 is also integrated into the same LSI circuit.

The monitor output control unit 5 is comprised of five internal signal monitor circuits 51, 52, 53, 54 and 55, all of which have the same circuit configuration. Connected to each internal signal monitor circuit are the CPU control bus S1, the interrupt signal bus S2, a RAM access request signal bus S3, a RAM access enable signal bus S4, a RAM control bus S5, and monitor output lines (external output terminals) S7, S8, S9 and S10 that output internal signals.

The CPU control bus S1 is comprised of signal lines for respective RD*, WR*, CS0*, CS1* and WAIT* signals. The RD* signal is an active low signal that indicates the timing of reading by the CPU 1. The WR* signal is an active low signal that indicates the timing of writing by the CPU 1. The CS0* signal is an active low signal that indicates the timing for the CPU 1 to access the ROM 2. The CS1* signal is an active low signal that indicates the timing for the CPU 1 to access either internal registers and the like of the logic circuit 3 or the RAM 4. The WAIT* signal is an active low signal for temporarily halting the operation of the CPU 1.

Figure 2:
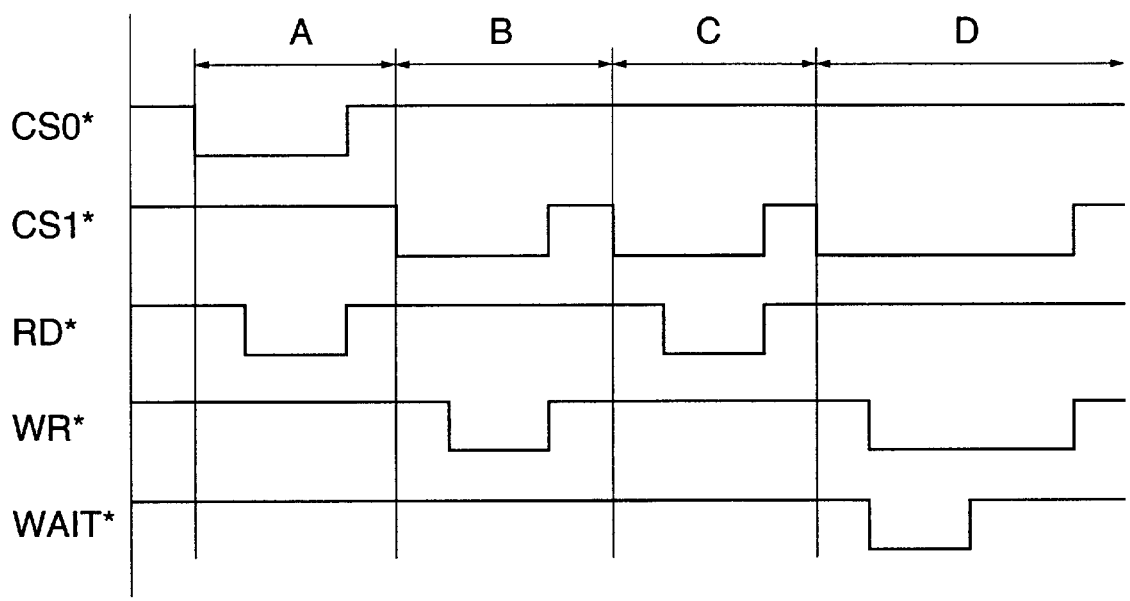
FIG. 2 is a timing chart illustrating transitions in RD*, WR*, CS0*, CS1* and WAIT* signals.

FIG. 2 is a timing chart illustrating transitions in the RD*, WR*, CS0*, CS1* and WAIT* signals. In the figure, the interval A is the timing of "read (RD) from the CS0 area", that is, the timing during which data is read out from ROM 2. The interval B is the timing of "write (WR) to the CS1 area", that is, the timing during which data is written to internal registers and the like in the LSI. The interval C is the timing of "read (RD) from the CS1 area", that is, the timing during which data is read from internal registers and the like. The interval D is the timing in which "write (WR) to the CS1 area was attempted but WAIT was active", that is, the timing during which the CPU 1 attempted to write to the RAM 4 but was made to wait due to slow access to the RAM 4.

Figure 3:
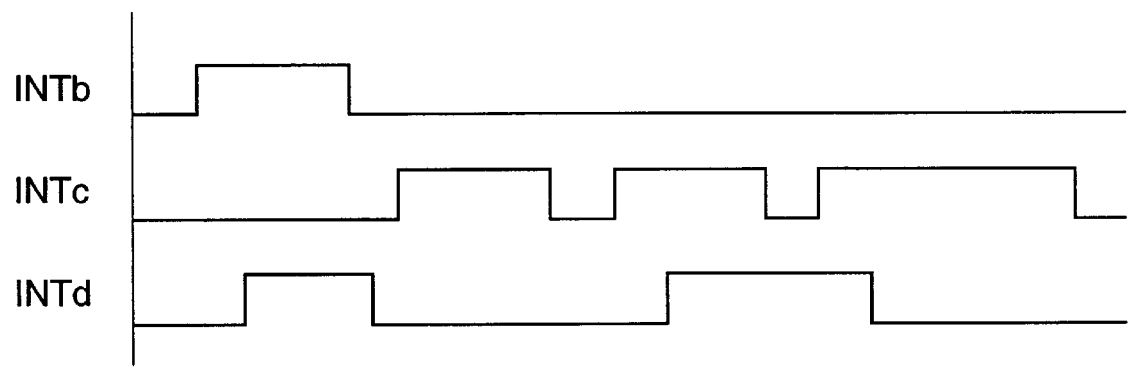
FIG. 3 is a timing chart illustrating transitions in INTb, INTc and INTd signals.

The interrupt signal bus S2 is comprised of signal lines for the INTb, INTc and INTd signals. The INTb signal is an active high interrupt signal that is output from the block 32b of the operation controller 32. The INTc signal is an active high interrupt signal that is output from the block 32c of the operation controller 32. The INTd signal is an active high interrupt signal that is output from the block 32d of the operation controller 32. FIG. 3 is a timing chart illustrating transitions in the INTb, INTc and INTd signals.

The RAM access request signal bus S3 is comprised of signal lines for the REQa, REQc and REQd signals. The REQa signal is an active high RAM access request signal that is output from the block 32a of the operation controller 32. The REQc signal is an active high RAM access request signal that is output from the block 32c of the operation controller 32. The REQd signal is an active high RAM access request signal that is output from the block 32d of the operation controller 32.

The RAM access enable signal bus S4 is comprised of signal lines for the ACKa*, ACKC* and ACKd* signals. The ACKa* signal is an active low RAM access enable signal that is output to the block 32a of the operation controller 32. The ACKc* signal is an active low RAM access enable signal that is output to the block 32c of the operation controller 32. The ACKd* signal is an active low RAM access enable signal that is output to the block 32d of the operation controller 32.

Figure 4:
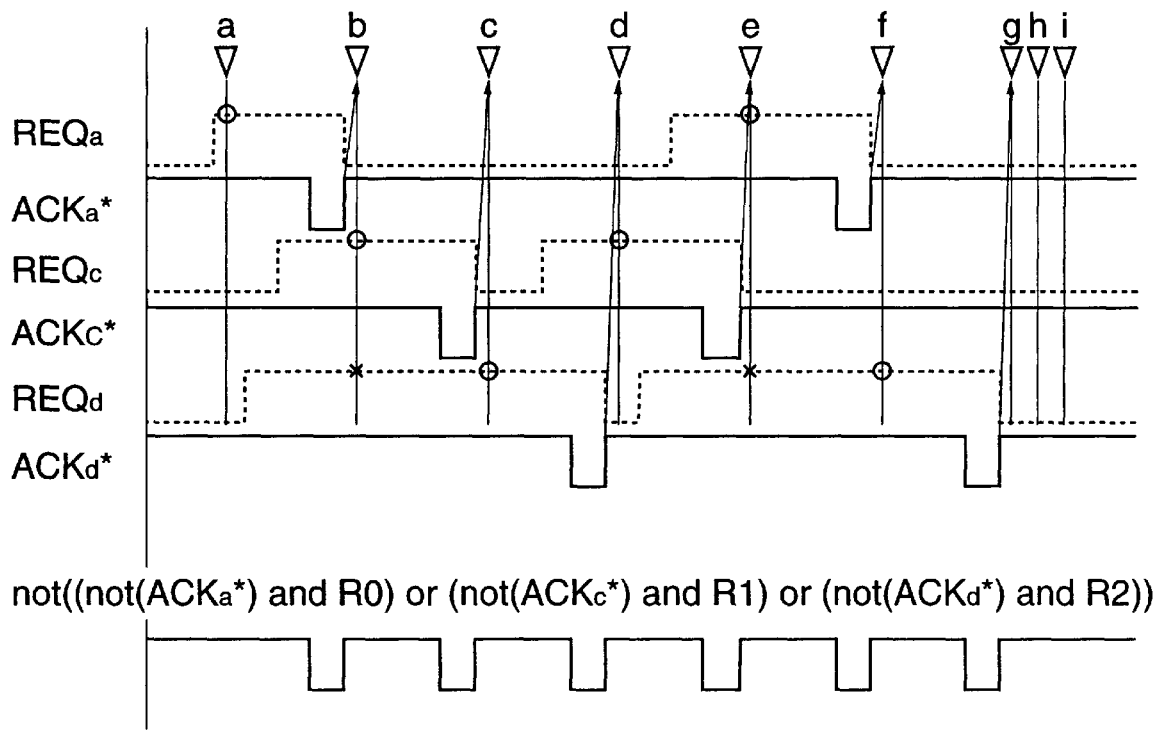
FIG. 4 is a timing chart illustrating transitions in REQa, REQC, REQd, ACKa*, ACKc* and ACKd* signals and an output signal S515.

FIG. 4 is a timing chart illustrating transitions in the REQa, REQc, REQd, ACKa*, ACKc* and ACKd* signals and the output signal S515. As shown in FIG. 4, at a time point "a", the RAM controller 33 checks the REQ signals output from the various operation controller 32 (blocks 32a, 32c, 32d), acknowledges a REQa signal output from the block 32a of the operation controller 32, and returns an ACKa* signal.

At a time point "b", the next timing after the ACKa* signal is returned, the RAM controller 33 acknowledges REQc* and REQd* signals that have been output from the blocks 32c and 32d of the operation controller 32. Here, since a priority order of REQa>REQc>REQd has been preset, an ACKc signal is returned in response to the REQc* signal. During this interval, the block 32d of the operation controller 32 is kept waiting.

Next, at the next time point "c", the RAM controller 33 operates in response to the REQd signal and then returns an ACKd* signal. Likewise, the RAM controller 33 operates in response to the REQC signal at a time point "d", the REQa signal selected from the REQa and REQd signals at a time point "e", and the REQd signal at a time point "f", to return ACKX* signals (x is an index corresponding to each REQ signal), respectively, at these time points. Time points "g", "h" and "i" show timing in which the next REQ signal is waited.

Since a DRAM is used as the RAM 4, the RAM control bus S5 is comprised of signal lines for the RAS*, CAS*, OE* and WE* signals. The RAS* signal is an active low signal that indicates timing in which a row address of the RAM 4 is determined. The CAS* signal is an active low signal that indicates timing in which a column address of the RAM 4 is determined. The OE* signal is an active low signal that indicates read timing of the RAM 4. The WE* signal is an active low signal that indicates write timing of the RAM 4.

Figure 5:
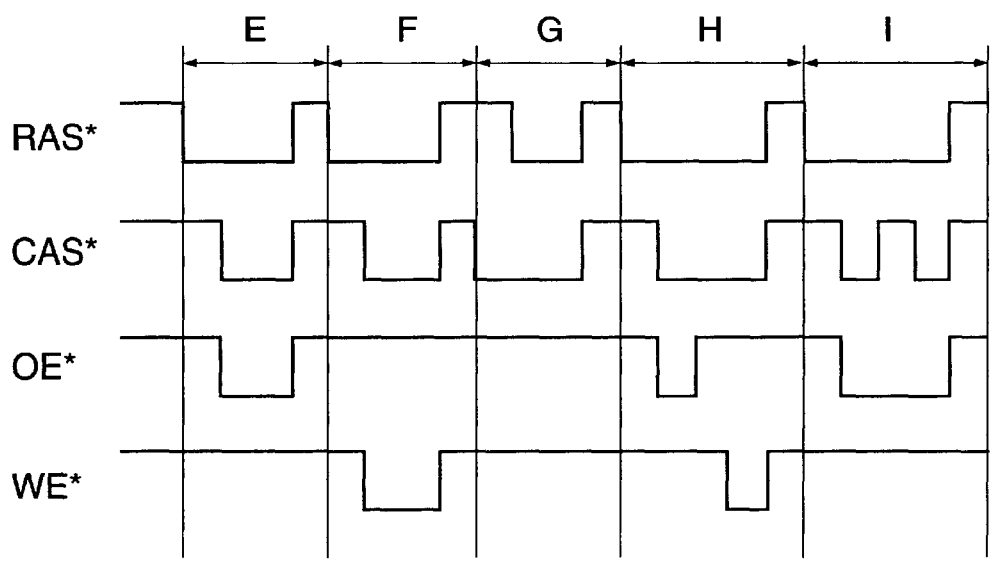
FIG. 5 is a timing chart illustrating transitions in RAS*, CAS*, OE* and WE* signals.

FIG. 5 is a timing chart illustrating transitions in the RAS*, CAS*, OE* and WE* signals. In FIG. 5, the interval E is read timing of the DRAM. The interval F is write timing of the DRAM. The interval G is DRAM refresh timing of the DRAM. The interval H is read-modify-write timing. The interval I is high-speed page mode consecutive read timing.

Next, the configuration of the internal signal monitor circuit 51 will be described. The internal signal monitor circuit 51 is comprised of five logic circuits 512, 513, 514, 515 and 516, a bus select circuit 511 that selects one of output signals from these five logic circuits, a bus select register 518 that carries out settings for the bus select circuit 511, a decoder 517 that converts 3-bit inputs into 5 bit outputs, and a 5-bit signal select register 519 that is commonly connected to the input sides of the aforementioned five logic circuits. This signal select register 519 is comprised of 5-bit select registers R0, R1, R2, R3 and R4.

Figure 6:
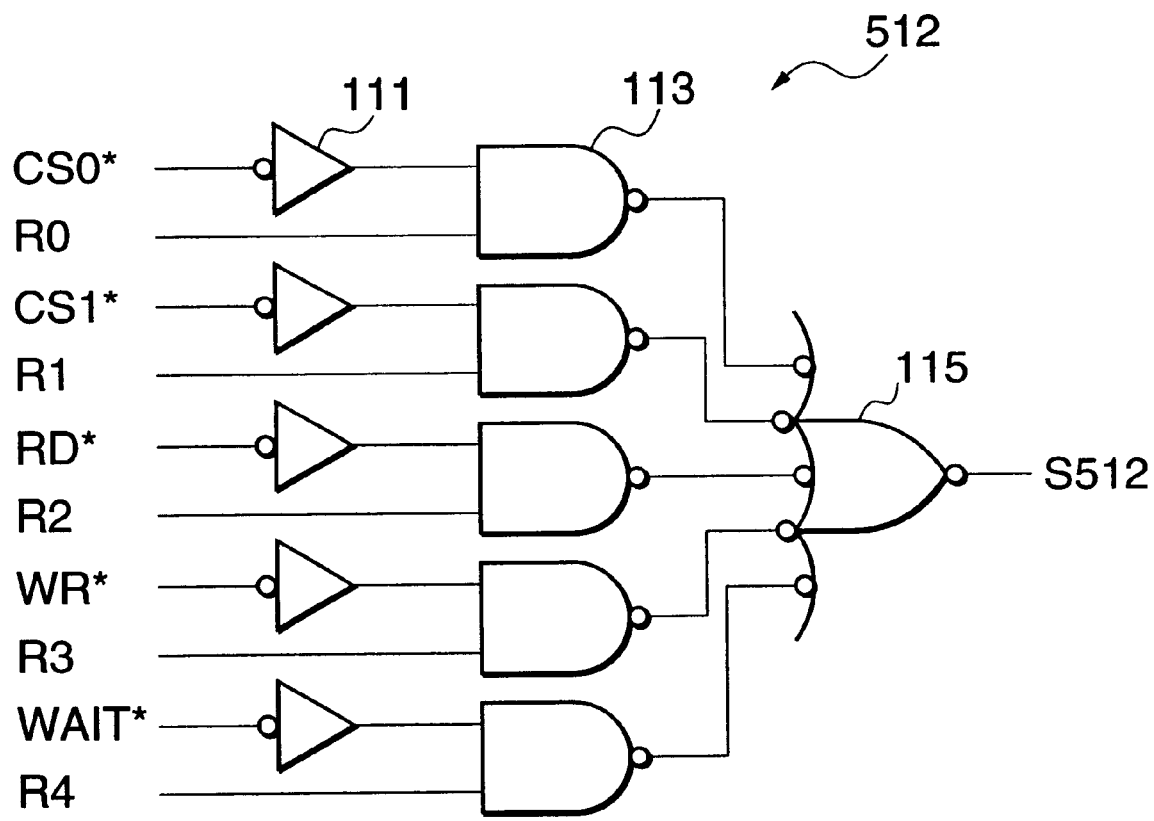
FIG. 6 is a circuit diagram illustrating the configuration of a logic circuit 512.

FIG. 6 is a circuit diagram illustrating the configuration of the logic circuit 512. This logic circuit 512 is comprised of five inverters 111, five NAND gates 113, and one negative-logic 5-input OR gate 115. Signals from the CPU control bus S1 and 5-bit settable signals from the select registers R0 to R4 are input to the logic circuit 512, and a signal S512 resulting from the logical operation is output from the logic circuit 512. If any one of the CS0*, CS1*, RD*, WR* or WAIT* signals selected by the signals from the select registers R0 to R4 is in the active low state, the output signal S512 will be at a low level.

Figure 7:
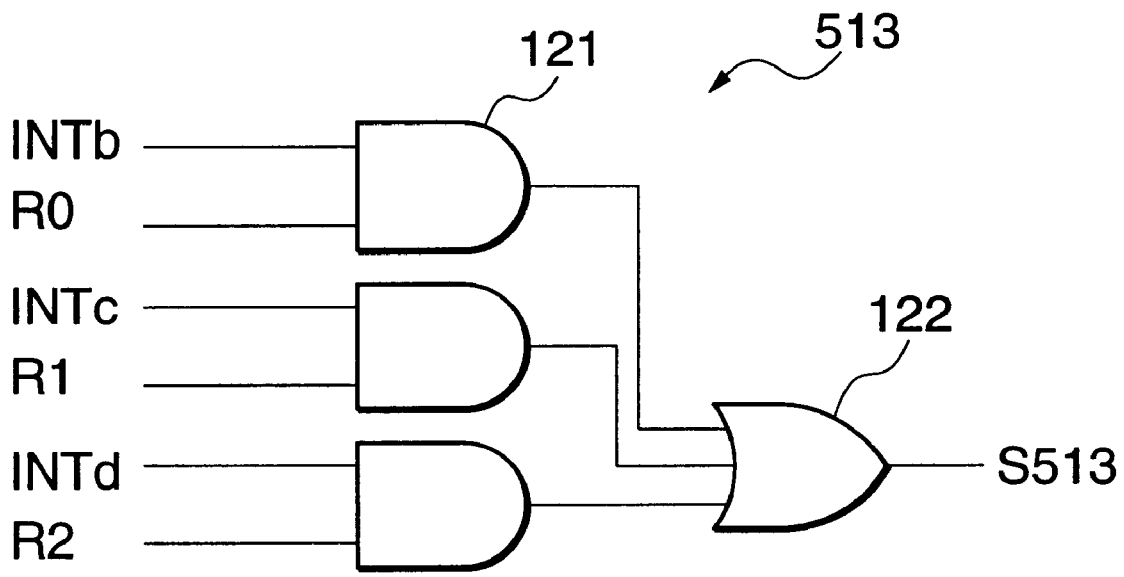
FIG. 7 is a circuit diagram illustrating the configuration of a logic circuit 513.

FIG. 7 is a circuit diagram illustrating the configuration of the logic circuit 513. This logic circuit 513 is comprised of three 2-input AND gates 121 and one 3-input OR gate 122. Signals from the interrupt control bus S2 and 3-bit settable signals from the select registers R0 to R2 are input to the logic circuit 513, and a signal S513 resulting from the logical operation is output from the logic circuit 513. If any one of the INTb, INTc or INTd signals selected by the signals from the select registers R0 to R2 is in the active high state, the output signal S513 will be at a high level.

Figure 8:
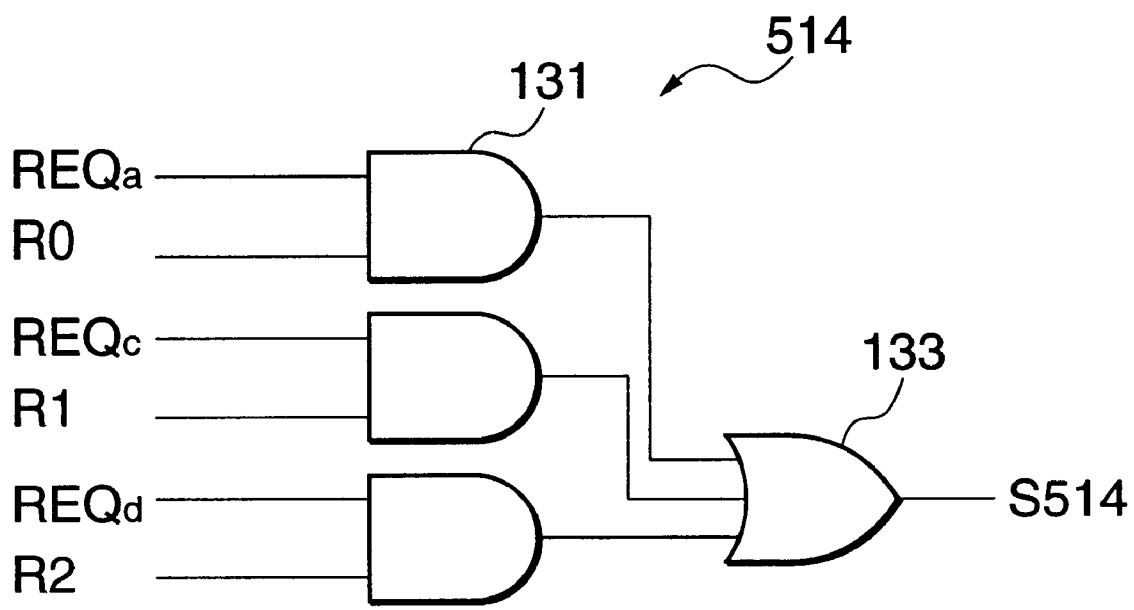
FIG. 8 is a circuit diagram illustrating the configuration of a logic circuit 514.

FIG. 8 is a circuit diagram illustrating the configuration of the logic circuit 514. This logic circuit 514 is comprised of three 2-input AND gates 131 and one 3-input OR gate 133. Signals from the RAM access request signal bus S3 and 3-bit settable signals from the select registers R0 to R2 are input to the logic circuit 514, and a signal S514 result from the logical operation is output from the logic circuit 514. If any one of the REQa, REQc or REQd signals selected by the signals from the select registers R0 to R2 is in the active high state, the output signal S514 will be at a high level.

Figure 9:
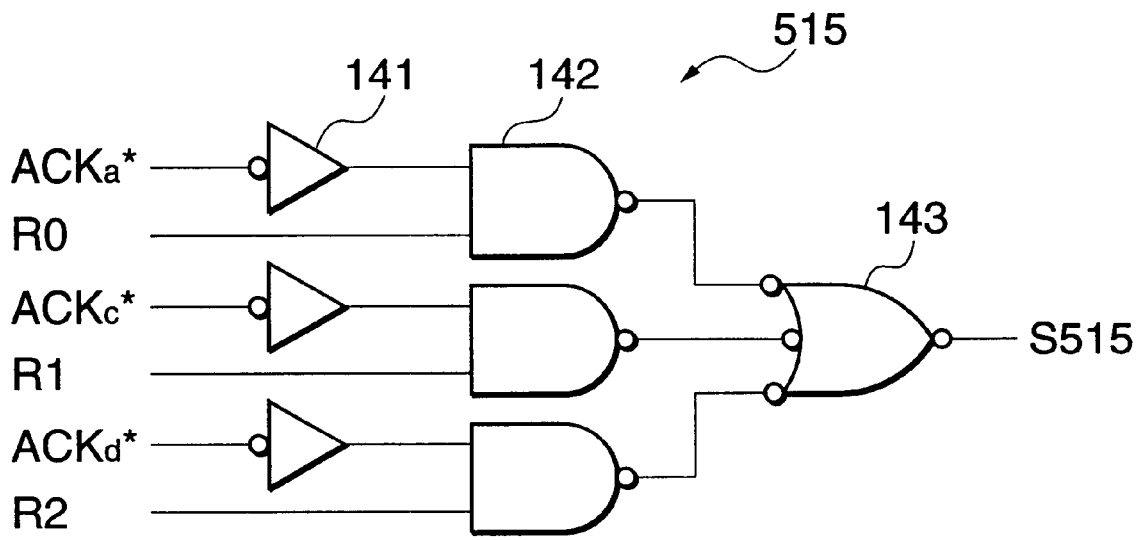
FIG. 9 is a circuit diagram illustrating the configuration of a logic circuit 515.

FIG. 9 is a circuit diagram illustrating the configuration of the logic circuit 515. This logic circuit 515 is comprised of three inverters 141, three 2-input NAND gates 142, and one negative-logic 3-input OR gate 143. Signals from the RAM access enable signal bus S4 and 3-bit settable signals from the select registers R0 to R2 are input to the logic circuit 515, and a signal S515 resulting from the logical operation is output from the logic circuit 515. If any one of the ACKa*, ACKc* or ACKd* signals selected by the signals from the select registers R0 to R2 is in the active low state, the output signal S515 will be at a low level.

Figure 10:
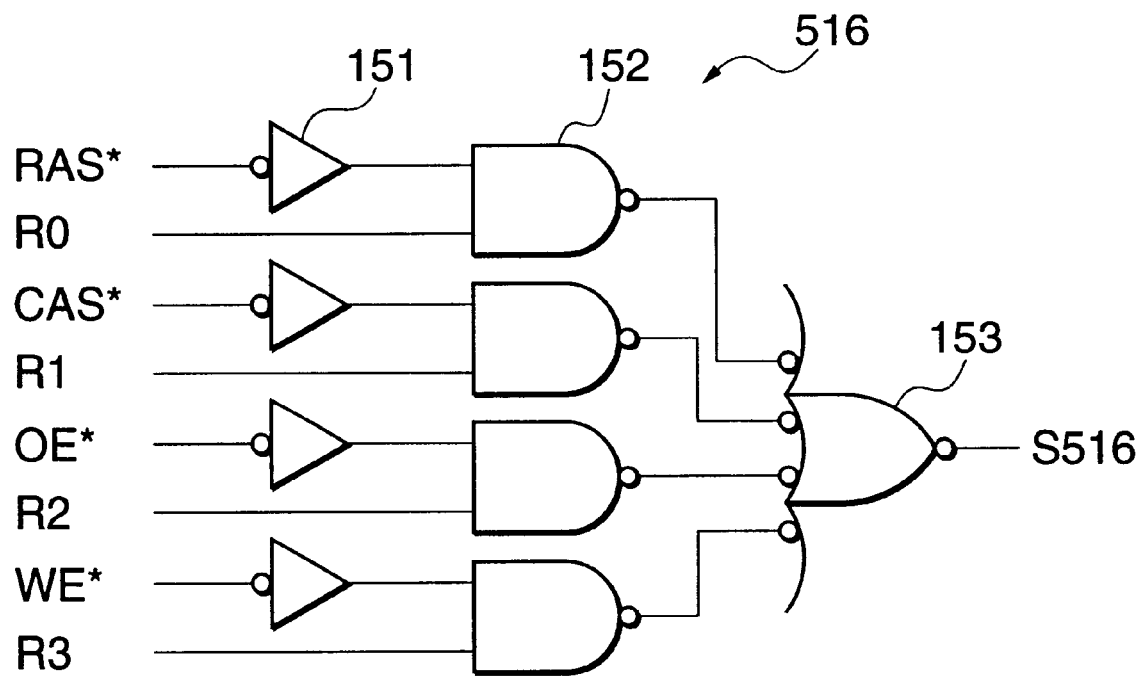
FIG. 10 is a circuit diagram illustrating the configuration of a logic circuit 516.

FIG. 10 is a circuit diagram illustrating the configuration of the logic circuit 516. This logic circuit 516 is comprised of four inverters 151, four 2-input NAND gates 152, and one negative-logic 4-input OR gate 153. Signals from the RAM control bus S5 and 4 bit settable signals from the select registers R0 to R3 are input to the logic circuit 516, and a signal S516 resulting from the logical operation is output from the logic circuit 516. If any one of the RAS*, CAS*, OE* or WE* signals selected by the signals from the select registers R0 to R3 is in the active low state, the output signal S516 will be at a low level.

Then, when the bus select register 518 has a value of "000", a signal selected from signals from the CPU control bus S1 and output as the output signal S512 is selected for monitoring by the bus select circuit 511. Moreover, when the bus select register 518 has a value of "001", a signal selected from signals from the CPU control bus S2 and output as the output signal S513 is selected for monitoring by the bus select circuit 511. Moreover, when the bus select register 518 has a value of "010", a signal selected from signals from the CPU control bus S3 and output as the output signal S514 is selected for monitoring by the bus select circuit 511. Moreover, when the bus select register 518 has a value of "011", a signal selected from signals from the CPU control bus S4 and output as the output signal S515 is selected for monitoring by the bus select circuit 511. Moreover, when the bus select register 518 has a value of "100", a signal selected from signals from the CPU control bus S5 and output as the output signal S515 is selected for monitoring by the bus select circuit 511.

Next, setting and operation of registers will be described with reference to FIGS. 4, 8 and 9. In the case where the timing in which the various operation controller 32 accesses the RAM 4 is to be monitored, it is necessary to output the REQa, REQb, and REQc signals and the ACKa*, ACKb* and ACKc* signals to six signal lines, however in the present embodiment, only five monitor output lines (external output terminals (pins)) S7 to S11 are available.

As shown in the relationship between the REQ and ACK* signals of FIG. 4, the REQ signals are output in different timings by the blocks 32a, 32c and 32d of the operation controller 32, and therefore three monitor output lines are necessary for monitoring. However, since the RAM controller 33 only returns one ACK* signal in response to all the REQ signals, by outputting a collective signal of all the ACKa*, ACKc* and ACKd* signals for monitoring, four monitor output lines are sufficient to enable assessment of the operation.

Specifically, each of the select registers R0, R1, R2 and R3 of the signal select register 519 in the internal signal monitor circuit 51 is set to "1", and hence the value of the bus select register 518 is set to "011", so that all ACK* signals on the RAM access enable signal bus S4 are output to the monitor output line S7. In other words, the signals shown at the bottom of FIG. 4 are output as the output signal S515 to the monitor output line S7.

Moreover, in the case where the REQa signal is to be output to the monitor output line S8, by setting only the value of a select register R0 of a signal select register 529 (the internal signal monitor circuits 52, 53, 54 and 55 all have the same configuration as the circuit 51 and therefore an index x is used to notate corresponding reference numerals of each internal block as 52x) in the internal signal monitor circuit 52 to "1", setting the values of the other select registers R1 to R4 to "0", and hence setting the value of the bus select register 528 to "010", the REQa signal from the RAM access control signal bus S3 is output to the monitor output line S8. Likewise, similar register settings are carried out in the cases where the REQc and REQd signals are to be output to the monitor output lines S9 and S10.

Accordingly, instead of using six signal lines (monitor output lines), only four signal lines can be used to monitor internal signals and assess whether the operation is correct or not.

As described above, according to the present embodiment, any arbitrary internal signal can be designated for outputting from any monitor output line (external output terminal). Therefore, by providing the same number of internal signal monitor circuits as the number of internal signals that need to be monitored simultaneously, a large number of internal signals can be monitored even if there are only a small number of monitor output lines (external output terminals).

In the above described first embodiment, a plurality of signals are selected from the signals for monitoring (for example, the five active low signals of CS0*, CS1*, RE*, WE* and WAIT* on the CPU control bus S1), and circuits that output active state OR gate signals are used. However, it may be so arranged that AND gate signals are output instead of OR gate signals. For example, to monitor the timing in which the CPU 1 writes data to the CS1 area as shown in FIG. 2, the active state AND gate signal output of the CS1* signal and RD* signal may be output.

Figure 11:
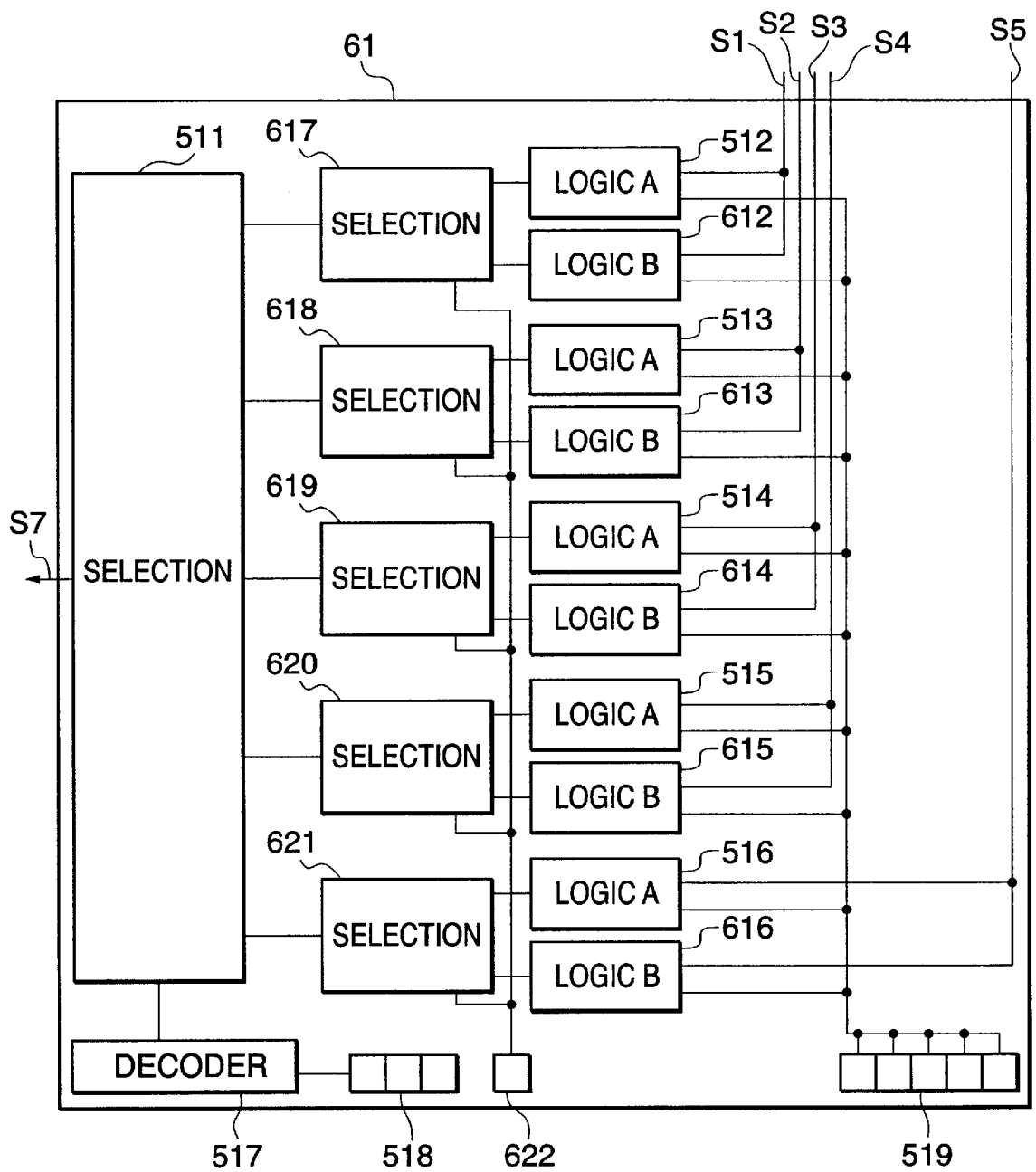
FIG. 11 is a block diagram illustrating the configuration of an internal signal monitor circuit as an output control circuit according to a second embodiment of the present invention.

FIG. 11 is a block diagram illustrating the configuration of an internal signal monitor circuit as an output control circuit according to a second embodiment of the present invention. Component elements corresponding to those of the above described first embodiment are designated by the same reference numerals and description thereof is omitted. Compared to the internal signal monitor circuit 51 illustrated in FIG. 1, this internal signal monitor circuit 61 is additionally provided with logic circuits B (612, 613, 614, 615 and 616), select circuits 617, 618, 619, 620 and 621 that switch between outputs from logic circuits A and outputs from the logic circuits B, and a register 622 that sets the values of these five select circuits.

Figure 12:
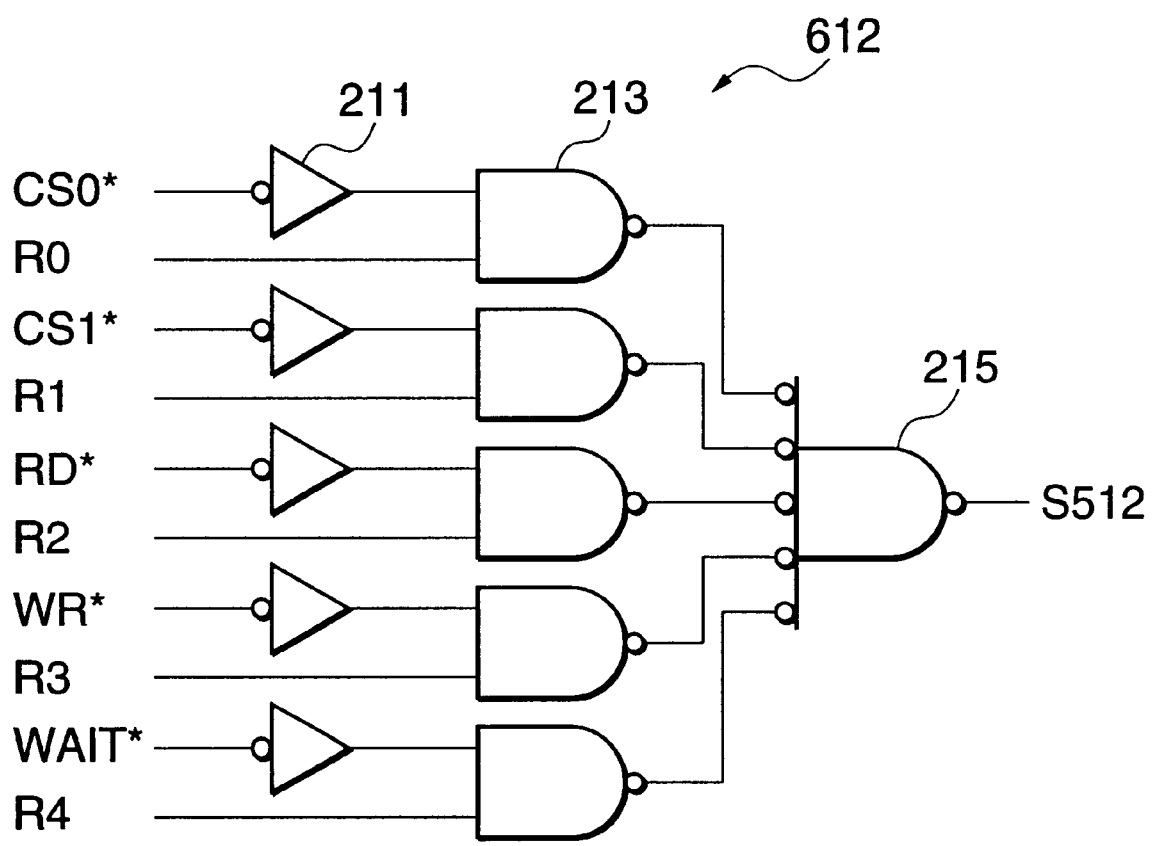
FIG. 12 is a circuit diagram illustrating the configuration of a logic circuit B612.

FIG. 12 is a circuit diagram illustrating the configuration of the logic circuit B612. This logic circuit B612 is comprised of five inverters 211, five NAND gates 213, and one negative-logic 5-input AND gate 215. Here, the signal select register 519 is set to "00110" to select CS1* and RD* signals, and the select register 622 is set to "1" so that the select circuit 617 selects the output from the logic circuit B612. The bus select register 518 is set to "000" so that a signal from the CPU control bus S1 is output to the monitor output line S7.

In this manner, according to the second embodiment, monitoring of internal signals can be efficiently carried out according to the output signals from the AND gates.

Embodiments of the present invention have been described above. However, the present invention is not limited to the configurations of these embodiments and is applicable to any configuration capable of achieving the functions recited in the appended claims or the functions possessed by the configurations of the embodiments.

For example, in the abovementioned embodiments, signals from the same signal group of buses S1 to S5 are input to all the five internal monitor circuits. However, signals from the same signal group do not necessarily have to be input to all the internal signal monitor circuits, and unique internal signals may be input to part of the internal signal monitor circuits.

What is claimed is:

1. A monitor output control circuit for an integrated circuit, comprising:
   a plurality of signal monitor circuits each of which monitors a plurality of internal signals from the integrated circuit; and a plurality of external output terminals each of which outputs a signal received from a corresponding one of said plurality of signal monitor circuits to outside of the integrated circuit, wherein each of said signal monitor circuits comprises:
a signal group select circuit that selects a predetermined signal group from the plurality of internal signals;
a logic circuit that carries out logical operations on the selected signal group; and
an external output circuit that outputs signals resulting from the logical operations to outside of the integrated circuit via a corresponding one of said external output terminals.

2. The monitor output control circuit according to claim 1, wherein said logic circuit comprises:
a plurality of individual logic circuits that individually carries out logical operations to the internal signals forming the selected signal group; and
a logic select circuit that selects one individual logic circuit from said plurality of individual logic circuits,
wherein said external output circuit outputs a signal resulting from a logical operation carried out by the selected individual logic circuit via one of said external output terminals.

3. The monitor output control circuit according to claim 1, wherein said logic circuit carries out a logical OR operation that causes a predetermined output to be output when at least one of the internal signals forming the selected signal group is in an active state.

4. The monitor output control circuit according to claim 1, wherein said logic circuit carries out a logical AND operation that causes a predetermined output to be output when all of the internal signals forming the selected signal group are in active states.

5. The monitor output control circuit according to claim 1, wherein said logic circuit comprises:
at least one logical OR circuit that carries out a logical OR operation that causes a predetermined output to be output when at least one of the internal signals forming the selected signal group is in an active state;
at least one logical AND circuit that causes a predetermined output to be output when all of the internal signals forming the selected signal group are in active states; and
an operation select circuit that selects either said logical OR circuit or said logical AND circuit.

* * * * *